United States Patent [19]

Naiff

[11] Patent Number: 4,494,218
[45] Date of Patent: Jan. 15, 1985

[54] READ ONLY MEMORY USING SERIES CONNECTED DEPLETION TRANSISTORS AS BUS LINES

[75] Inventor: Kenneth L. Naiff, Happauge, N.Y.

[73] Assignee: General Instrument Corporation, Clifton, N.J.

[21] Appl. No.: 383,755

[22] Filed: Jun. 1, 1982

[51] Int. Cl.³ .......................... G11C 5/02; G11C 5/06; G11C 17/00

[52] U.S. Cl. ..................................... 365/104; 365/94; 357/45

[58] Field of Search .......................... 365/104, 103, 94; 357/45, 41; 340/825.85, 825.87, 825.9, 825.91

[56] References Cited

U.S. PATENT DOCUMENTS

| | | | |
|---|---|---|---|
| 4,059,826 | 11/1977 | Rogers | 365/104 |
| 4,084,105 | 4/1978 | Teranishi et al. | 365/104 |
| 4,207,585 | 6/1980 | Rao | 357/45 |
| 4,271,421 | 6/1981 | McElroy | 357/41 |
| 4,342,100 | 7/1982 | Kuo | 365/104 |
| 4,350,992 | 9/1982 | Tubbs | 365/104 |
| 4,384,345 | 5/1983 | Mikome | 357/45 |

Primary Examiner—Stuart N. Hecker
Assistant Examiner—Glenn Gossage
Attorney, Agent, or Firm—James & Franklin

[57] ABSTRACT

The memory circuit is formed by depositing spaced, parallel polysilicon strips on an insulating layer on the surface of the substrate. Spaced, parallel, elongated regions, which extend in a direction orthogonal to the strips, are formed in the substrate. Each elongated region comprises diffused segments (forming sources and drains) separated by non-diffused areas, masked by the strips, (forming channels). Spaced regions, extending parallel to the strips, are diffused to interconnect adjacent ones of the elongated regions, at intervals therealong. The strips are also subjected to the diffusion to produce conductivity appropriate for functioning as gates and gate interconnections. The elongated regions each form series connected enhancement mode devices of relatively low thresholds. Alternate elongated regions are subjected to a first implant to convert same into series connected depletion mode devices. The channels of certain of the enhancement devices, selected in accordance with the desired memory program, are subjected to a second implant to increase the threshold thereof. By applying a voltage, between the lower and higher thresholds, to a strip and creating a potential difference between adjacent alternate elongated regions, the enhancement device at the intersection of the elongated region between the adjacent alternate elongated regions and the strip is read to ascertain if same has been rendered conductive, thereby producing a memory output.

16 Claims, 6 Drawing Figures

READ ONLY MEMORY USING SERIES CONNECTED DEPLETION TRANSISTORS AS BUS LINES

The present invention relates to read only memories (ROMs) and, more particularly, to a read only memory having a NOR logic structure and which is fabricated using silicon gate techniques.

A read only memory is an electronic information storage device in which the retained information is determined by the structure of the memory. Unlike electronic memories in which information is retained by the storage of electrical charges, the information in a read only memory does not dissipate with time but is permanently defined and, therefore, does not need to be periodically refreshed. The information is thus not lost in the event of a power failure. However, the information cannot be altered.

A read only memory consists of a matrix array of semiconductor devices. Each device in the array defines a single bit of information. The information stored at each location may be either a "zero" or a "one" and can be defined in a number of different ways.

In some read only memories, information is defined by having either an operable or inoperable transistor at each point in the array. In this case, a particular location in the array is selected and the device at that location is tested. If the device is operable, one type of information is present. If not, the other type of information is present.

In other read only memories, information is defined by devices of different types, such as enhancement mode (normally non-conductive) and depletion mode (normally conductive) transistors. In this case, the information stored at a particular location is ascertained by sensing whether the transistor at the selected location is conductive. If conductive, the device is a depletion mode device defining one type of information. On the other hand, if the device is not conductive, then it is an enhancement mode device defining the other type of information.

In still other memories, information is defined by the threshold of the device. The array is made up of all enhancement mode transistors with some of the transistors having a higher threshold than others. By applying a voltage which is higher than the threshold of the lower threshold devices, but lower than the threshold of the higher threshold devices, it is possible to ascertain whether the device at a selected location is rendered conductive, reflecting that information of one type is present therein, or not rendered conductive, indicating the presence of the other type of information.

In designing read only memories, factors such as the density of the transistor array, access time, and ease of fabrication are important. The memory is designed to have as high a density as possible, such that the maximum amount of information can be stored per unit of chip area. The memory is designed to have the minimum access time, such that the stored information can be obtained therefrom as quickly as possible. Moreover, ease of fabrication is considered because the amount and type of fabrication steps which are required define, to a great extent, the cost of the memory.

For some time, read only memories were fabricated using aluminum gate metal oxide fabrication techniques. However, it was found that the array density, that is, the number of devices per unit of chip area, could be increased from 20%–30% if silicon gate fabrication techniques were utilized. In addition, silicon gate techniques have other well known advantages such as self-alignment of the channels of the formed transistors with the gates thereof.

However, silicon gate techniques also have their drawbacks. It is difficult to fabricate arrays using the silicon gate techniques because the polysilicon material normally can be deposited only at locations where transistors are required. If the polysilicon layer is deposited in areas where transistors are not desired, such as over the portion of the substrate between two transistors, in order to inter-connect same, a deleterious parasitic transistor effect often occurs. In order to avoid this, it is heretofore been necessary to create openings in the layers over each gate to form a contact and use buses on the surface of the substrate which avoid areas between transistors to connect the various gates. This requires extra fabrication steps, increases the complexity of the design considerably, and requires substantial space, reducing the density of the array and increasing the production costs.

The speed of the memory, that is, the access time, is determined in part by the logic structure of the transistor array. Most read only memories utilize transistor devices which are connected in parallel to form the columns of the array. Recently, a read only memory has been disclosed which utilizes series connected transistor devices in a way which increases the density and the speed of the memory. It is also known that the use of transistors in a NOR logic structure increases the speed of the memory.

Since the information stored in a read only memory is fabricated into the structure thereof, the masks which are utilized to fabricate the memory must be structured in accordance with the information to be contained in the memory. The mask which defines the information program is normally required at an intermediate step in the process. Consequently, it is normally impossible for a chip manufacturer to inventory partially completed read only memories. However, this problem could be circumvented if a fabrication process could be designed in which the step which defines the information program occurred near the end of the process. In this instance, almost completed memory chips could be inventoried. A mask defining the information program required by a particular customer is then developed upon order, the almost completed chips are taken from inventory and completed with the mask. This improves the cost effectiveness of the manufacturer's product flow because it permits the manufacturer to partially fabricate a large number of almost complete read only memory chips for inventory and then to complete the chips in accordance with customer requirements, thereby optimizing the utilization of the fabilities.

It is, therefore, a prime object of the present invention to provide a read only memory fabricated with silicon gate techniques.

It is another object of the present invention to provide a silicon gate read only memory utilizing a NOR logic structure for increased speed.

It is another object of the present invention to provide a silicon gate read only memory requiring no specially formed contacts or leads in the array.

It is another object of the present invention to provide a silicon gate read only memory wherein parasitic transistor effects are eliminated by depleting the substrate below the gate interconnections.

It is another object of the present invention to provide a silicon gate read only memory wherein the individual transistors are very small, permitting a high density array.

It is another object of the present invention to provide a silicon gate read only memory wherein the last mask utilized in the fabrication process defines the information program so as to permit inventorying of partially completed chips.

In accordance with one aspect of the present invention, a semiconductor circuit, suitable for use as a read only memory, is fabricated on a substrate by first forming an insulating layer on the substrate surface. Upon the insulating layer, spaced, substantially parallel, polysilicon strips are deposited. The strips extend in a given direction. Selected areas of the insulating layer, not covered by the polysilicon strips, are removed to expose the substrate in a pattern which includes spaced, substantially parallel, elongated regions, interrupted below the polysilicon strips, which extend in a direction orthogonal to the given direction, and spaced regions interconnecting adjacent elongated regions. The substrate is then subjected to an impurity source so as to diffuse the polysilicon strips and the exposed regions of the substrate. The non-diffused areas of the substrate, below the polysilicon strips, in all alternate elongated regions are implanted so as to electrically connect the diffused segments in those regions, respectively. Certain non-diffused areas of the substrate, below the polysilicon strips, in elongated regions not receiving the first implant, are subjected to a second implant so as to program the memory. Finally, a protective coating is applied to the substrate.

The polysilicon strips are utilized in the above process to provide three functions. First, the strips are subjected to the impurity source such that their conductivity is increased so that they function as gates for each of the transistor devices, as well as leads or interconnections between the gates of all devices which are physically aligned along the given direction. Second, the polysilicon strips act as a mask for the diffusion, thereby delineating the non-diffused channel area of each transistor device in accordance with the dimensions of the gate thereof. Third, the polysilicon strips assist in defining the spaced diffusion regions which interconnect adjacent elongated regions.

The diffused segments in each spaced, elongated region form the sources and drains for the transistors, in accordance with conventional silicon gate procedures. The diffused segments are separated, below the polysilicon strips, by non-diffused areas. These interruptions in the diffusion pattern form the channels between the sources and drains. The channels are defined by the dimensions of the strips which form the gates for the transistors.

Implanting the non-diffused area of the substrate, below the polysilicon strips, in each alternate elongated region, that is, the channels of the transistors which are formed from alternate elongated regions, produces from each alternate elongated region a plurality of series connected depletion mode devices, which extend in a direction orthogonal to the given direction. In this manner, parallel, spaced, continuous electrical connections are formed below the substrate. These connections will function in the same manner as a metallized bus, situated above the substrate surface, in previous fabrication techniques. Because these alternate elongated regions are always conductive, any parasitic transistor action caused by the polysilicon strips passing over these regions has no effect on the operation of the circuit.

The elongated regions not receiving the first implant each form a plurality of series connected enhancement mode transistors. The spaced interconnecting regions serve to connect the sources of the enhancement mode devices to one adjacent group of series connected depletion mode transistors and the drains of the enhancement mode transistors to the other adjacent group of series connected depletion mode transistors. Thus, each enhancement mode transistor serves as a potential connection between two adjacent, below the surface "buses" formed of groups of series connected depletion mode transistors. If a potential difference is applied between adjacent groups of depletion mode transistors, and one of the enhancement mode transistors connected therebetween is rendered conductive by the application of a proper voltage to its gate, the electrical connection between the depletion mode groups can be detected.

Selected ones of the enhancement mode transistors are subjected to an additional implant so as to increase the threshold voltage required to render same conductive. This is done in accordance with the information to be programmed into the memory. The voltage applied to the gate of the particular enhancement mode transistor to be read is at a magnitude which is higher than the threshold voltage for the non-selected enhancement mode devices, but lower than the threshold voltage of the selected devices. Thus, the application of the voltage to the gate of a particular transistor will or will not render same conductive, depending upon whether this transistor has been subjected to the additional implant or not. In this way, the information defined at any point in the array, by the enhancement mode transistor at that point, can be read.

Thus, in accordance with a second aspect of the invention, the semiconductor circuit can be viewed as comprising first and second groups of depletion mode devices. The depletion mode devices in each of the first and second groups are respectively series connected, through junctions. A group of series connected enhancement mode devices, each including a gate, a source, and a drain, is also provided. Means are provided for operatively electrically connecting the source of each enhancement mode device to a junction in one of the first and second groups of depletion mode devices. Means are provided for operatively electrically interconnecting the drain of each enhancement mode device to a junction in the other of the first and second groups of depletion mode devices.

This circuit can be utilized as a read only memory by selecting certain of the enhancement mode devices to have higher thresholds than the thresholds of the remaining enhancement mode devices. Means are provided for applying an energizing voltage, of a magnitude less than the higher threshold, to the gate of one of the enhancement mode devices. Means are provided for applying a potential difference between the first and second groups of depletion mode devices. Means are provided for sensing the presence of an operative electrical connection, formed by the conductivity of the enhancement mode device whose gate received the energizing voltage, between the first and second groups of depletion mode transistors.

In this way, the circuit is programmed to contain certain information by fabricating certain of the enhancement mode devices to have a higher threshold than other enhancement mode devices. The information at any point in the array is determined by whether the energizing voltage renders conductive the enhancement mode device at that point in the array.

To these and such other objects as may hereinafter appear, the present invention relates to a silicon gate read only memory, as described in detail in the following specification, and defined in the annexed claims, taken together with the accompanying drawings, wherein like numerals refer to like parts and in which:

Figure 1:
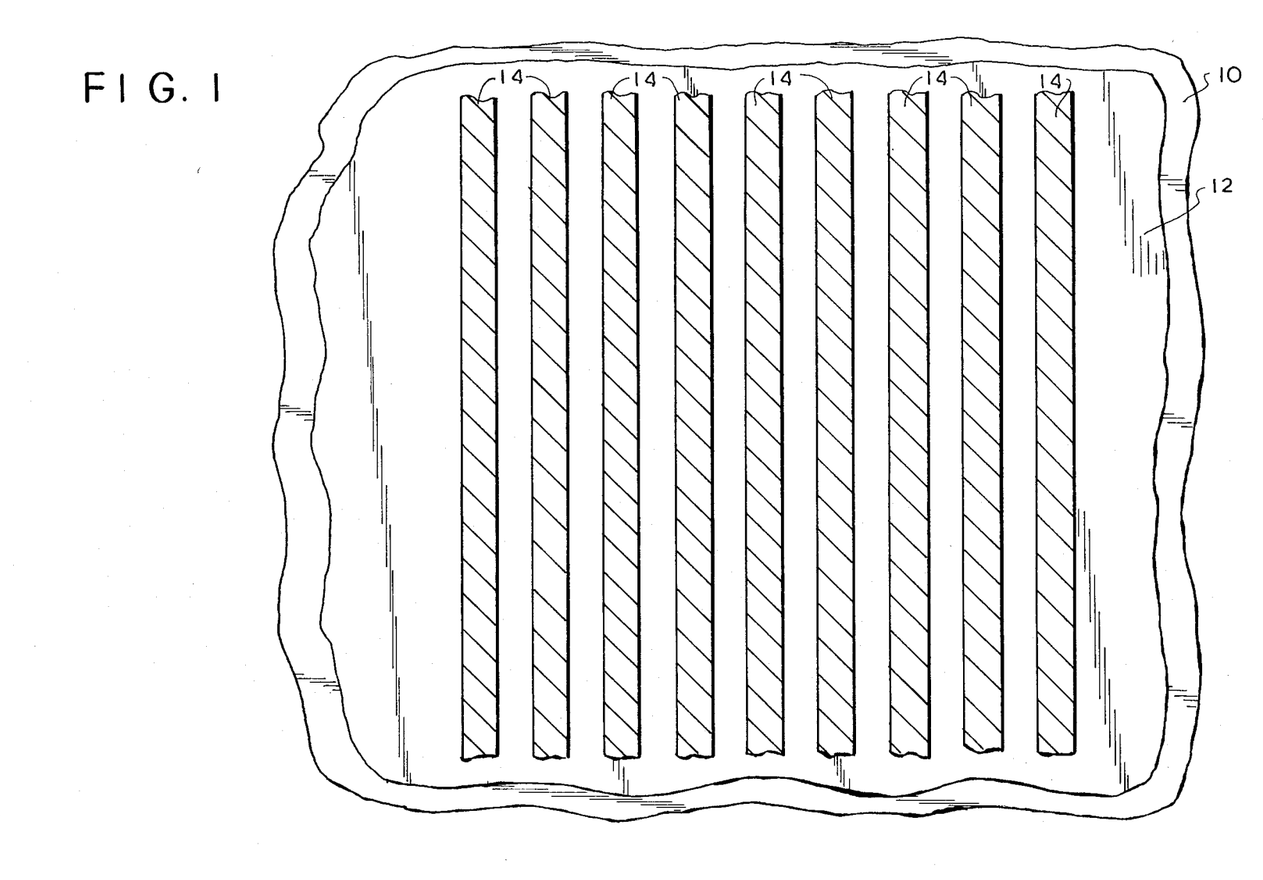
FIG. 1 is a plan view of a portion of a substrate having an insulating layer and spaced parallel polysilicon strips thereon.

The process begins by selecting a substrate 10 with the appropriate properties and preparing the surface thereof in a well known manner. A relatively thin insulating layer 12, formed of silicon dioxide or the like, is uniformly formed over the entire surface of substrate 10. A mask is then placed on the surface of insulating layer 12. The mask has elongated, spaced, parallelly aligned, equal width openings thereon. A plurality of spaced, equal width, elongated polysilicon strips 14, all extending in the same direction, are formed through the mask, as is illustrated in FIG. 1, and the mask is then removed.

Figure 2:
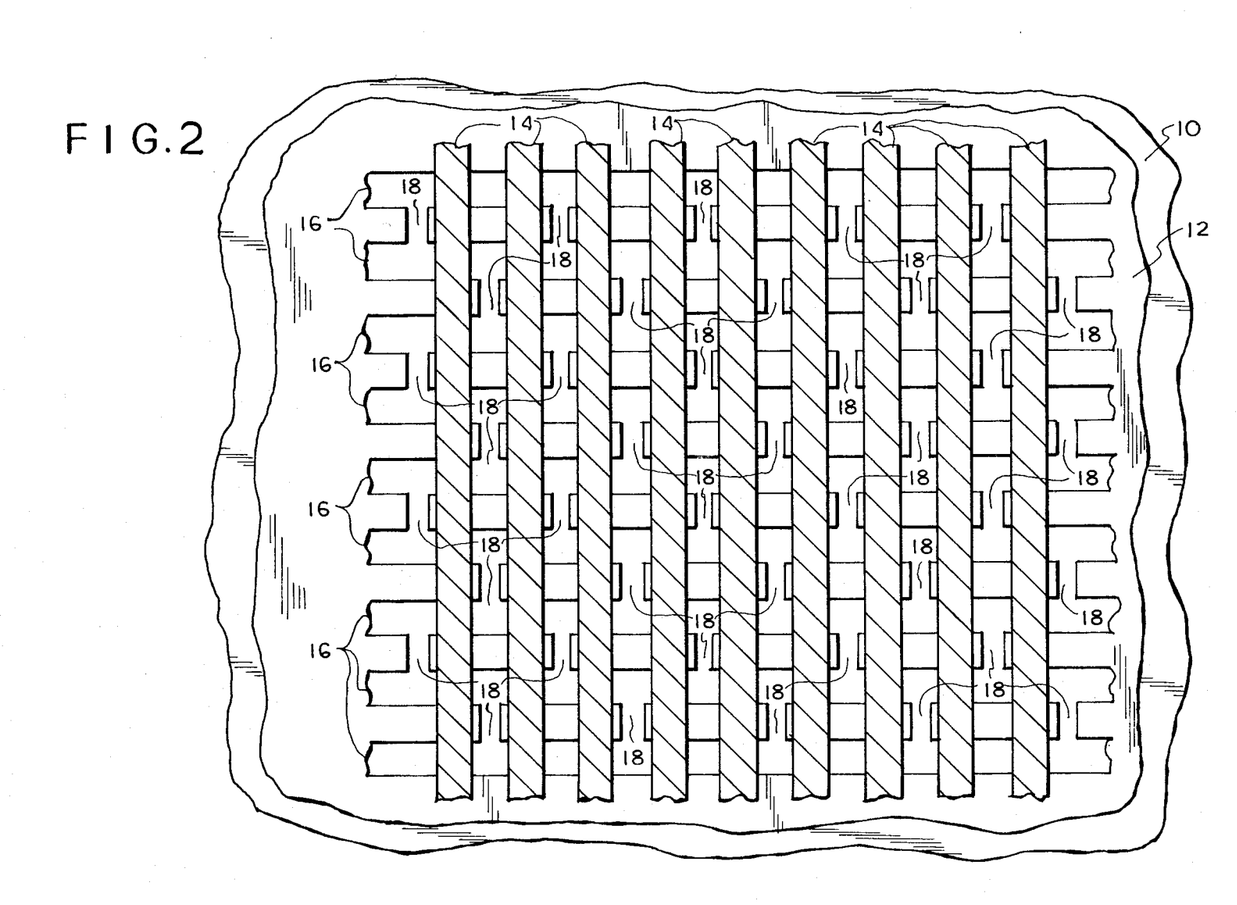
FIG. 2 is a plan view of the portion of the substrate shown in FIG. 1, after same has been masked and etched in the necessary diffusion pattern.

The exposed surface of insulating layer 12 is then masked and etched, by any one of a number of well known processes, to prepare the substrate for diffusion. The diffusion pattern, as illustrated in FIG. 2, comprises regions extending in two directions. The first regions 16 are elongated in a direction generally orthogonal to the direction of elongation of strips 14. Each of the regions 16 is discontinuous, that is, interrupted at spaced intervals, by non-diffused areas which are situated below polysilicon strips 14, which mask same from diffusion. The second regions 18 extend between adjacent regions 16, in a direction generally parallel to strips 14, and interconnect the diffused segments of adjacent regions 16 at spaced intervals therealong.

It should be noted that regions 18 are actually substantially as wide as the distance between adjacent polysilicon strips 14. However, on FIG. 2, regions 18 are shown as having a width slightly less than the distance between adjacent strips 14, such that the line delineating the edge thereof does not appear coincident with the line delineating the edge of the adjacent strip 14, thus rendering regions 18 invisible on FIG. 2. FIG. 2 has been prepared in this manner only for purposes of ease of understanding. In the actual process, it is preferable to have the strips 14 delineate the boundaries of regions 18.

Once the insulating layer 12 has been etched in the pattern shown in FIG. 2, the substrate is exposed to a diffusion impurity source. The result will be to dope the exposed segments of regions 16 and regions 18, as well as the exposed polysilicon strips 14. Doping the exposed segments of regions 16 will create sources and drains for the enhancement mode and depletion mode devices being formed. Doping the polysilicon strips 14 will increase the conductivity of those strips so that they can function as gates for the devices, as well as interconnections between the gates of all vertically aligned devices. Assuming that the original substrate was a P-type substrate, the diffusion will create N-type regions therein. At this point in the process, each region 16 is made up of a plurality of series connected enhancement mode devices. Each of the devices is extremely small, only approximately 3.3 microns square. Thus, a high density is achieved. Regions 18 serve to electrically interconnect adjacent groups of devices.

The next step in the process involves implanting the non-diffused areas in alternate regions 16 (now referred to as 16') with ions, such as boron. The implant is provided along areas 20, shown in FIG. 3. This implant converts the enhancement devices formed in regions 16' into heavily depleted depletion mode devices which are normally conductive. The depletion mode devices preferably have a threshold of −8 volts. Heavily depleting the non-diffused areas eliminates the effects of any parasitic transistor action caused by polysilicon strips passing over regions 16'. Thus, alternate groups of series connected enhancement mode devices are converted into groups of series connected depletion mode devices, each of which functions as a below the surface bus.

Figure 3:
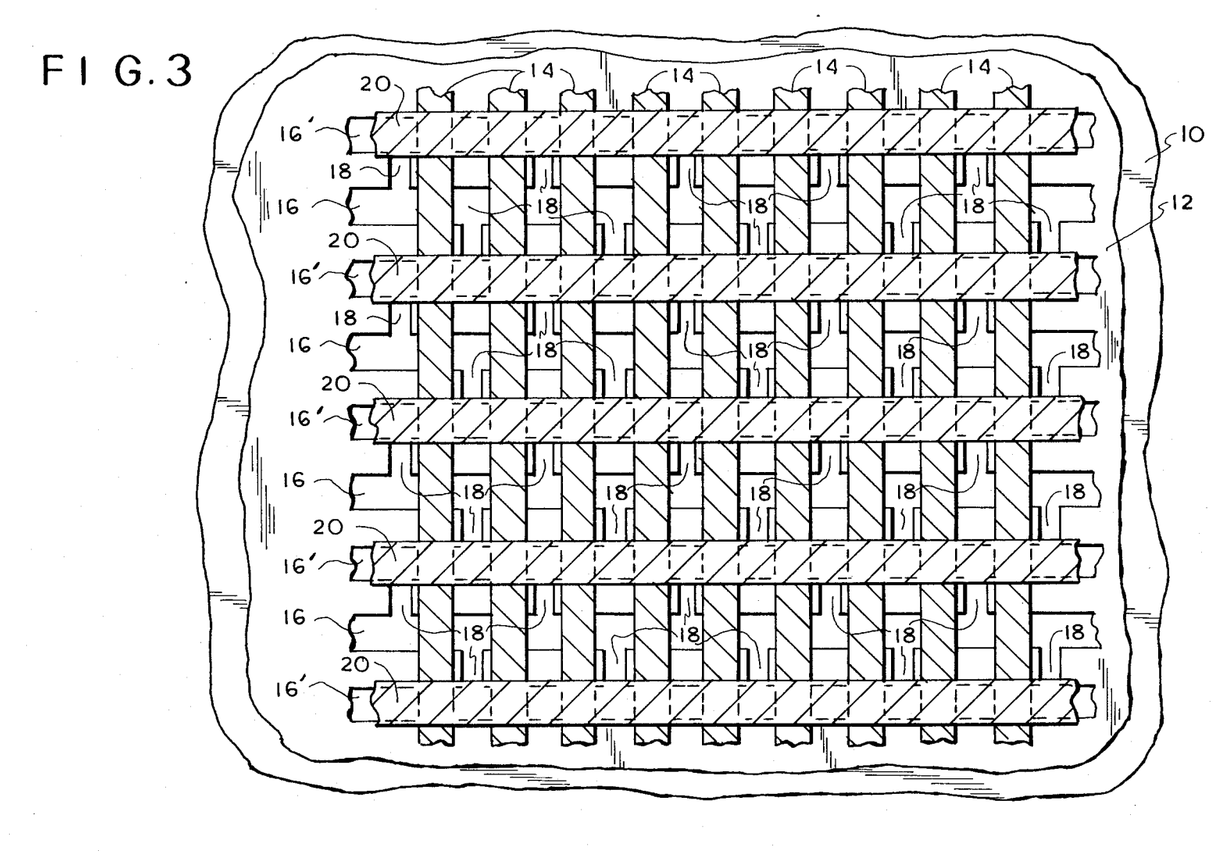
FIG. 3 is a plan view of a portion of the substrate shown in FIG. 2, after diffusion and the first implantation step which creates the depletion mode devices.

In this way, each group of series connected enhancement mode devices, formed from regions 16, is provided, at each side thereof, with a group of series connected depletion mode devices, formed from regions 16'. Regions 18 serve to connect the sources of all of the enhancement mode devices, formed from regions 16, to the "bus" formed by the series connected depletion mode devices, within one of the adjacent regions 16' and the drains of each of the enhancement mode transistors, formed from the region 16, with the "bus" formed from the series connected depletion mode transistors of the other adjacent region 16'.

At this point in the process, the memory is ready to be programmed in accordance with the information to be contained therein. Since the programming occurs near the very end of the process, it is possible to fabricate the substrate up to this point and place same in inventory. When a customer order is received, the partially fabricated substrate is taken from inventory, programmed in accordance with the customer's requirements, and then completed. In this manner, a large number of almost completed substrates can be inventoried.

Figure 4:
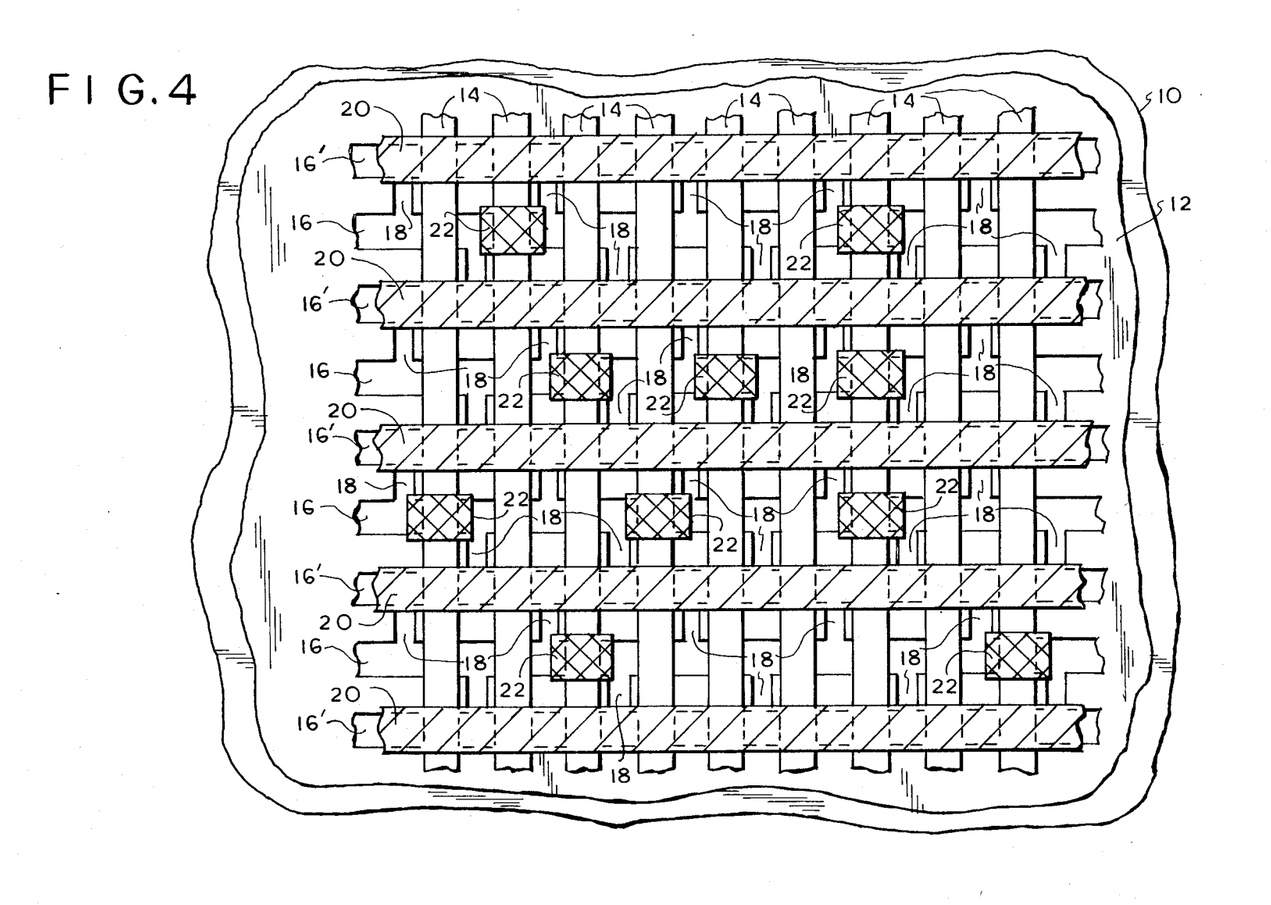
FIG. 4 is a plan view of the substrate shown in FIG. 3, after certain of the enhancement mode devices have been implanted to increase the threshold thereof.

The programming takes place by altering the threshold voltage of selected ones of the enhancement mode devices. As indicated in FIG. 4, the channels of selected enhancement mode devices, as indicated by the cross-patched areas 22, receive an additional implant, the effect of which is to significantly raise the threshold of the implanted enhancement mode devices. Thus, the enhancement mode devices are differentiated on the basis of their thresholds.

An energizing voltage, of a magnitude between the lower threshold and the higher threshold, can be applied to the gate of one of the enhancement mode devices. If the device has not received the implant 22, the result of which is to raise the threshold thereof, this voltage will render the device conductive. Otherwise, the device will remain nonconductive. Thus, the information contained in the array is defined by the threshold voltage of the various enhancement mode transistors.

Figure 5:
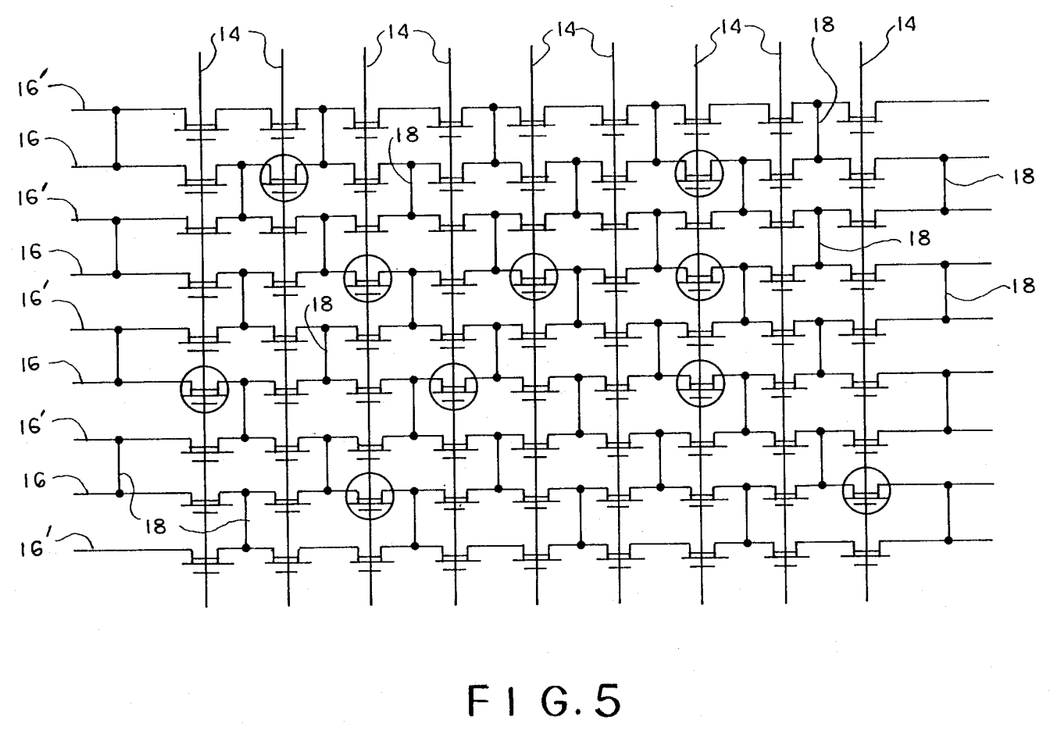
FIG. 5 is a schematic diagram of the structure formed by the process of the present invention; and, FIG. 6 is a schematic diagram of the equivalent circuit for that shown in FIG. 5, illustrating the NOR logic of the present invention.

To better understand the structure of the circuit created by the above-described fabrication process, the reader is referred to FIG. 5, which is a schematic diagram of the structure formed. In this diagram, depletion mode devices are depicted with thick base lines, whereas enhancement mode devices are depicted with thin base lines. Enhancement mode devices having the higher thresholds are encircled.

As will now be evident, regions 16', each of which comprises a plurality of series connected depletion mode transistors, extend along a horizontal line. Interposed between adjacent regions 16' are regions 16 which comprise series connected enhancement mode transistors. Regions 18 serve to connect the source of each of the enhancement mode transistors in each region 16 to junctions between depletion mode transistors in one of the adjacent regions 16'. Regions 18 also serve to connect the drains of the enhancement mode transistors in regions 16 with junctions between the series connected depletion mode transistors in the other adjacent region 16'. Strips 14 not only act as gates for each of the transistors, but also as interconnections between the gates of all transistors which are vertically aligned.

Figure 6:
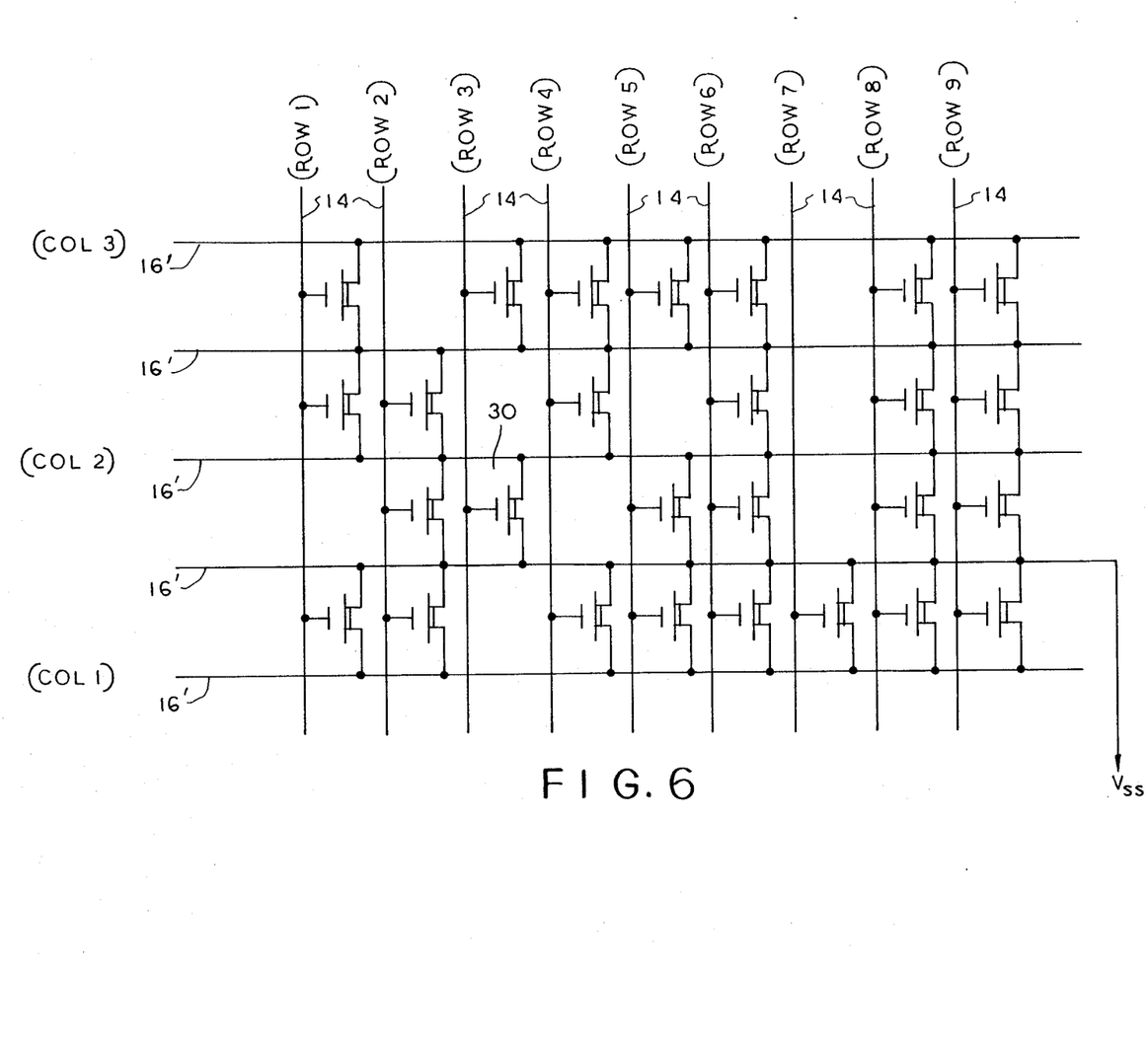

The equivalent circuit is shown in FIG. 6 which illustrates the NOR logic structure of the array. In this figure, the enhancement mode transistors having the higher threshold voltage are considered to be inoperative, because the energizing voltage applied thereto will not render same conductive. Accordingly, these enhancement mode transistors do not appear on the drawing.

The array illustrated in FIG. 6 is utilized in a memory by connecting each strip 14 to a different output of the row selection circuitry and by connecting every other region 16' to a different output of the column selection circuitry. One of the remaining regions 16' adjacent to the selected column is connected to a source of potential $V_{SS}$. An energizing voltage, between the lower and higher thresholds, is applied to a selected row by the row selection circuit. The selected column is connected to a sense amplifier by the column select circuit.

For example, assume the third row (from the left) and the second column (from the bottom) are selected. Strip 14 forming row 3 is energized through the row select circuit with an energizing voltage higher than the threshold of the non-implanted devices, but lower than the threshold of the implanted devices. Region 16', which forms column 2, is connected to the sense amplifier through the column select circuit. If a non-implanted transistor is present in row 3 between column 2 and the region 16' connected to $V_{SS}$, the sense amplifier will sense a voltage near $V_{SS}$ on column 2. This is the case as seen on the diagram because non-implanted transistor 30 exists between column 2 and region 16' immediately below same.

On the other hand, assume row 7 and column 2 are selected. No non-implanted transistors exist in row 7 between column 2 and either adjacent region 16'. Accordingly, the sense amplifier connected to column 2 will sense a zero voltage.

It will now be appreciated that the present invention relates to a read only memory which can be fabricated using well known silicon gate technology. The size of the array is reduced because each device is extremely small and because all separate contacts to the devices have been avoided by permitting the polysilicon strips to cross over diffused areas. Deleterious parasitic effects have been eliminated by heavily depleting the non-diffused areas over which the polysilicon strips pass to interconnect enhancement mode devices such that same are always conductive. NOR logic structure is used to enhance the access speed of the memory.

While only a single preferred embodiment of the present invention has been described herein for purposes of illustration, it is obvious that many variations and modifications could be made thereto. For example, whilst "diffusion" as a means of doping in referred to herein, it should be understood that alterate methods of doping maybe be employed with equally satisfactory refills. It is intended to cover all of these variations and modifications which fall within the scope of the present invention, as defined by the following claims.

I claim:

1. A circuit suitable for use as a read only memory comprising first and second spaced transistor groups, each of said first and second groups comprising depletion mode transistors series connected through junctions, a third transistor group, interposed between said first and second groups, said third group comprising series connected enhancement mode devices, each having a gate, a source and a drain, selected ones of said enhancement mode devices having a higher threshold than nonselected ones, means for operatively electrically connecting the source of each enhancement mode device in said third group to one of said junctions in one of said first or second groups, means for electrically connecting the drain of each enhancement mode device in said third group to one of said junctions in the other of said first and second groups, means for applying a potential difference between said first and second groups and means for applying an energizing voltage, of magnitude less than said higher threshold, to said gate of one of the enhancement mode devices in said third group, such that the presence of an operative electrical connection between said first and second group can be sensed when said energizing voltage is applied.

2. A semiconductor circuit comprising a region within a substrate, said region comprising (a) spaced, substantially parallel first sub-regions extending in a given direction, each of said first sub-regions comprising doped segments separated by non-doped areas, adjacent ones of said diffused segments, respectively forming a source and a drain, with the non-doped area therebetween forming a channel, each channel area in each of said first sub-regions being aligned, along a direction orthogonal to said given direction, with a channel area in each other of said first sub-regions, and (b) second doped sub-regions interconnecting said segments in adjacent ones of said first sub-regions, spaced conductive polysilicon strips situated on the surface of said substrate, an insulating layer interposed between said strips and said surface, each of said strips being aligned with and above a different set of said aligned channel areas, to form a gate for each device formed from said aligned channel areas, the channel areas in alternate ones of said first sub-regions comprising depletion mode devices, selected channel areas in the other alternate ones of said first sub-regions comprising enhancement mode devices having a different threshold from that of the enhancement mode devices formed of the nonselected channel areas in said other alternate ones of said first sub-regions.

3. A circuit suitable for use as a read only memory comprising first and second spaced groups of series connected transistors, each of said first and second groups defining a sub-circuit which is conductive under normal operating conditions, a third group of series connected potential transistors interposed between said first and second groups, selected ones of said potential transistors being potentially conductive and others being non-conductive under normal operating conditions, means for operably connecting each of said potential transistors in said third group between said first and second groups, means for applying a potential difference between said first and second groups and means for applying a voltage, capable of rendering conductive a potentially conductive transistor, to a potential transistor, such that the presence of an operative electrical connection between said first and second groups can be sensed when said energizing voltage is applied.

4. A semiconductor circuit comprising a region within a substrate, said region comprising (a) spaced, substantially parallel first sub-regions extending in a given direction, each of said first sub-regions comprising doped segments separated by non-doped areas, adjacent ones of said doped segments, respectively forming a source and a drain, with the non-doped area therebetween forming a channel, each channel area in each of said first sub-regions being aligned, along a direction orthogonal to said given direction, with a channel area in each other of said first sub-regions, and (b) second doped sub-regions interconnecting said segments in adjacent ones of said first sub-regions, spaced doped polysilicon strips situated on the surface of said substrate, an insulating layer interposed between said strips and said surface, each of said strips being aligned with and above a different set of said aligned channel areas, to form a gate for each device formed from said aligned channel areas, the channel areas in alternate ones of said first sub-regions comprising depletion mode devices, selected channel areas in the other alternate ones of said first sub-regions comprising enhancement mode devices which are potentially conductive under normal operating conditions and enhancement mode devices which are non-conductive under normal operating conditions.

5. A semiconductor circuit comprising first and second groups of depletion mode devices, the depletion mode devices in each group being series connected through junctions, a group of series connected enhancement mode devices, each comprising a source and a drain, means for operatively electrically connecting the source of each enhancement mode device to one of said junctions in one of said first and second groups and means for operatively electrically interconnecting the drain of each enhancement mode device to one of said junctions in the other of said first and second groups.

6. The circuit of claim 5, wherein selected ones of said enhancement mode devices have threshold voltages which are higher than the threshold voltages of non-selected ones of said enhancement mode devices.

7. The circuit of claim 5, wherein said group of enhancement mode devices is interposed between said first and second groups.

8. The circuit of claim 5, wherein each of said devices comprises a gate and wherein said gates are formed of doped polysilicon.

9. The circuit of claim 5, wherein each of said devices has a gate and wherein one device from said third group is aligned with a device in each of said first and second groups and further comprising doped polysilicon means for interconnecting the gates of said aligned devices.

10. The circuit of claim 5, wherein the depletion mode transistors in each of said first and second groups respectively extend along a given direction.

11. The circuit of claim 10, wherein the enhancement mode devices in said group extend along said given direction.

12. The circuit of claim 10, wherein each of said enhancement mode devices is aligned, along a direction orthogonal to said given direction, with a corresponding one of the depletion mode devices in each of said first and second groups.

13. The circuit of claim 12, wherein the gates of the devices aligned in said direction orthogonal to said given direction are operatively electrically interconnected.

14. A method for eliminating the deleterious effects of parasitic transistor action in a semiconductor circuit of the type having first, second, third, fourth and fifth enhancement mode transistors spaced along the substrate, each having a source, drain, channel and gate, the channels of the transistors being aligned and the gates of the transistors being interconnected by a conductive strip, the sources of the second and fourth transistors being connected to the first and third transistors, respectively, and the drains of the second and fourth transistors being connected to the third transistor and fifth transistor, respectively, the method comprising the steps of: heavily depleting the channels of the first, third and fifth transistors, to convert same into depletion mode transistors; applying a potential difference between a selected pair of adjacent depletion mode transistors, and applying an energizing voltage to the strip, the parasitic transistor action normally present between adjacent transistors, due to the energized strip, thereby being eliminated.

15. A circuit suitable for use in a read only memory comprising first and second spaced transistor groups, each of said first and second groups comprising first, second, and third depletion mode transistors series connected through junctions, a third transistor group, interposed between said first and second groups, said third group comprising first, second, and third enhancement mode transistors, each having a control terminal and an output circuit comprising first and second terminals, selected ones of said enhancement mode transistors having a higher threshold than non-selected ones, means for operably electrically connecting said first terminal of one of said enhancement mode transistors in said third group to the junction between said first and second depletion mode transistors in said first group, means for electrically connecting said second terminal of said enhancement mode transistor in said third group to the junction between said second and third depletion mode transistor in said second group, means for applying a potential difference between said first and second groups and means for applying an energizing voltage, of magnitude less than said higher threshhold, to said control terminal of said enhancement mode transistor in said third group, such that the presence of an operative electrical connection between said first and second groups can be sensed when said energizing voltage is applied.

16. A semiconductor circuit comprising first and second groups of depletion mode devices, each comprising first, second, and third devices, the depletion mode devices in each group being series connected through junctions, a group of series connected enhancement mode devices, each comprising a first and a second terminal, means for operatively electrically connecting said first terminal of one of said enhancement mode devices to the junction between said first and second depletion mode devices in said first group and means for operably electrically interconnecting said second terminal of said enhancement mode device to the junction between said second and third devices in said second group.

* * * * *